United States Patent [19]

Sanjana et al.

[11] Patent Number: 4,590,539
[45] Date of Patent: May 20, 1986

[54] POLYARAMID LAMINATE

[75] Inventors: Zal N. Sanjana, Penn Hills Township, Allegheny County; Joseph R. Marchetti, Greensburg, both of Pa.

[73] Assignee: Westinghouse Electric Corp., Pittsburgh, Pa.

[21] Appl. No.: 734,371

[22] Filed: May 15, 1985

[51] Int. Cl.⁴ .............................................. H05K 7/02
[52] U.S. Cl. .................... 361/400; 156/307.1; 156/307.4; 156/307.7; 174/68.5; 428/252; 428/267; 428/272; 428/413; 428/416; 428/901; 428/902
[58] Field of Search .............. 428/413, 416, 252, 267, 428/272, 901, 902; 156/307.1, 307.4, 307.7; 174/68.5; 361/400

[56] References Cited

U.S. PATENT DOCUMENTS

| 4,501,787 | 2/1985 | Marchetti et al. | 428/901 |
| 4,513,055 | 4/1985 | Leibowitz | 428/901 |
| 4,524,107 | 6/1985 | Marchetti et al. | 428/413 |
| 4,550,128 | 10/1985 | Chellis | 428/413 |

Primary Examiner—James J. Bell
Attorney, Agent, or Firm—R. D. Fuerle

[57] ABSTRACT

Disclosed is a composite of a polyaramid woven fabric and a resin. The resin contains water, a water-based emulsion of an epoxy selected from the group consisting of diglycidyl ethers of bisphenol A, diglycidyl ethers of bisphenol F, novolacs, and mixtures thereof, water-compatible curing agents for the emulsion, and a water-compatible catalyst for the emulsion. The emulsion can be cured to the B-stage to form a prepreg and prepregs can be stacked with copper sheets and heated and pressed to form a laminate for use in making a printed wiring board.

19 Claims, 1 Drawing Figure

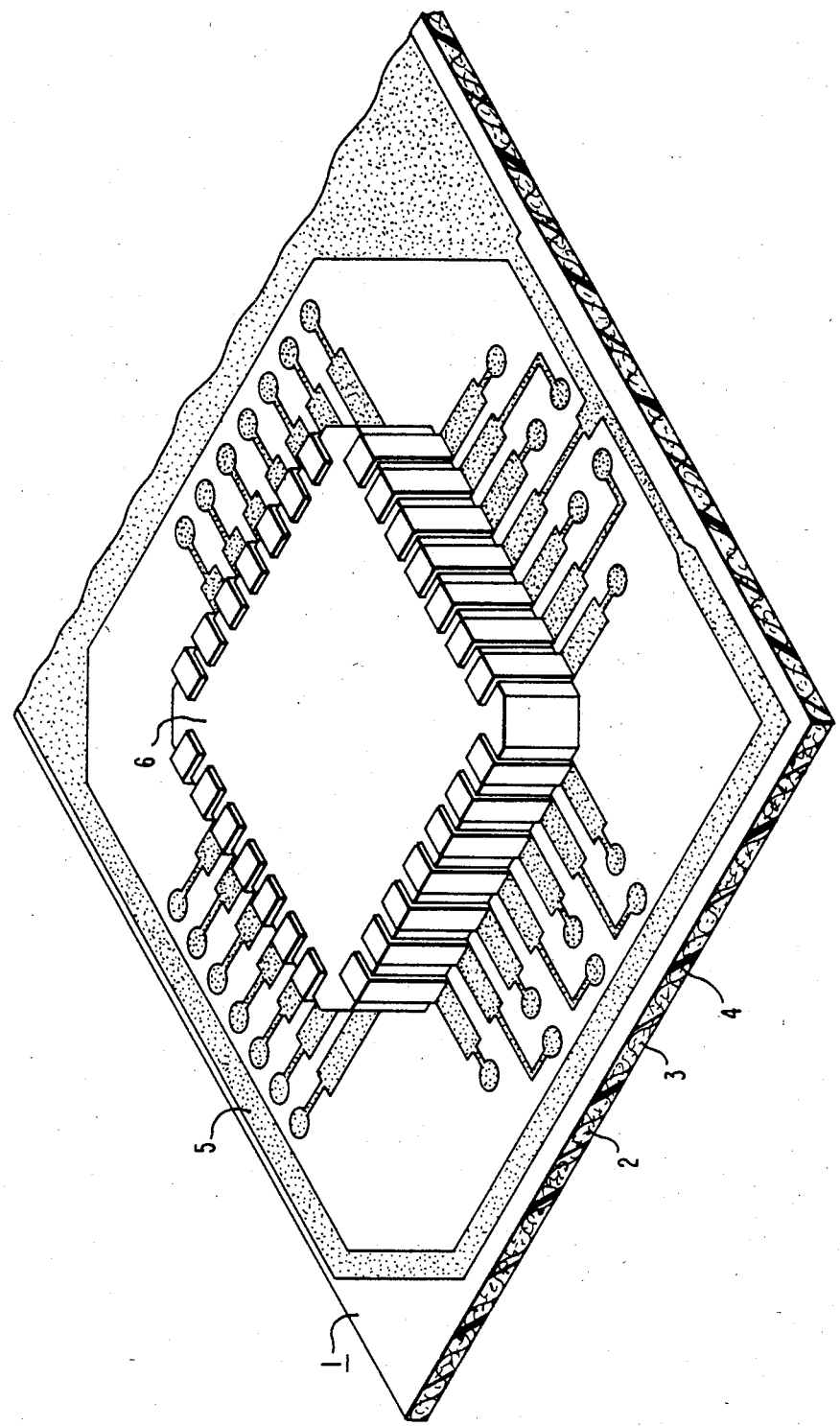

POLYARAMID LAMINATE

CROSS-REFERENCE TO RELATED DISCLOSURES

This application is related to U.S. patent application Ser. No. 591,359, filed Mar. 20, 1984, by J. R. Marchetti et al., entitled "Toughened Thermoset Laminates," now U.S. Pat. No. 4,524,107.

BACKGROUND OF THE INVENTION

Integrated circuits made with dual-in-line packages have leads which are soldered to a printed wiring board. The leads provide a degree of flexibility between the package and the printed wiring board and, therefore, thermal mismatches between the packages and the board do not result in the cracking of the board. These systems are accepted by the Department of Defense if they are capable of withstanding thermal cycling from $-60°$ C. to $150°$ C.

Because the leads provide a longer electrical pathway, dual-in-line packages are not suitable for very high speed processing of information (generally known as VHSIC). In order to shorten the electrical pathway, leadless chip carriers (LCC) have been developed. Leadless chip carriers have pads that are directly soldered onto the printed wiring board, thereby reducing the length of the circuit and increasing the density of the components mounted on the board. The latter consideration is very important for very large seak integration (VLSI). It was found, however, that printed wiring boards made from E-glass (electrical grade glass) fabric impregnated with epoxy or polyimide resins were not thermally compatible with the chip carrier material. If the leadless chip carrier is a ceramic (known as a hermetic chip carrier, HCC), the ceramic has a coefficient of thermal expansion in the XY plane of $6 \times 10^{-6}/°C$. while the laminate has a coefficient of thermal expansion of 12 to $18 \times 10^{-6}/°C$. As a result, during thermal cycling, the solder joint is strained and undergoes a plastic flow. After a number of cycles, the solder joint usually cracks, breaking the electrical circuit.

An attempt was made to solve this problem by manufacturing printed wiring boards using a polyaramid fiber instead of the E-glass fabrics. Polyaramid fibers have the interesting property of having a negative coefficient of thermal expansion in their axial direction of a magnitude of $2 \times 10^{-6}/°C$. It has been found that printed wiring boards made with a woven polyaramid fabric and a polyimide or an epoxy resin have coefficients of thermal expansion of about $6 \times 10^{-6}/°C$., and that solder joint cracking usually does not occur with these boards.

Unfortunately, the solution to one problem always seems to create other problems and, in this case, the use of the polyaramid, while it eliminated solder joint cracking, resulted in microcracking of the laminate itself during the thermal cycling from $-60°$ C. to $150°$ C., required by the Department of Defense. The microcracking of the laminate cannot be tolerated because the microcracks may themselves break a circuit or they may permit the absorption of moisture, resulting in shorts. Until now, the problem of eliminating microcracking in polyaramid fiber expoxy laminates has not been solved.

SUMMARY OF THE INVENTION

We have discovered that microcracking in polyaramid fiber epoxy laminates can be greatly reduced or eliminated if the laminate is made from a water-based epoxy emulsion rather than from an organic solvent-based epoxy, as it usually is. We have found that this change in the epoxy composition results in virtually no microcracking in the resulting laminate. In addition, by substituting water for organic solvents, we have made the manufacture of these laminates non-air-polluting and have eliminated the problem of disposing of volatile organic solvents. Even though we have changed the epoxy formulation, we have found that the composition will nevertheless B-stage in the same manner as conventional organic solvent-based epoxies, and the laminate can be manufactured using the standard pre-pregging process. We have also found that brominated water-based epoxies can also be used in the process of this invention to make laminates that are flame retardant.

DESCRIPTION OF THE INVENTION

The accompanying drawing is an isometric view showing a certain presently preferred embodiment of a leadless chip carrier mounted on a printed wiring board according to this invention.

In the drawing, the laminate 1 consists of fabric 2 of woven polyaramid fibers 3 embedded in an epoxy matrix 4, and having a sheet of copper 5 on one side. The copper sheet has been formed into the pattern of a printed circuit, and leadless chip carrier 6 has been soldered to the copper 5.

The printed wiring board laminates of this invention, are prepared from a composite of polyaramid fibers in an epoxy resin matrix. The preferred polyaramid fiber material is poly(p-phenylene terephthalamide), which is sold commercially by DuPont under the trademark "Kevlar." The fibers are in the form of a woven fabric, rather than as mat or roving, because it is only the woven fabric that eliminates the problem of solder joint cracking. A plain weave is preferred as plain weaves are commonly used in the manufacture of circuit boards to reduce dimensional instability. A tight weave is preferred as that reduces the resin content of the laminate, and of the commercially available weaves the preferred material is $34 \times 34$ count, 0.003" thick.

The resin portion of the composite consists of water, a water-based epoxy emulsion, a curing agent, and a catalyst. The epoxy used in the emulsion is a water emulsifiable epoxy, and can be a diglycidyl ether of bisphenol A, a diglycidyl ether of bisphenol F, or a novolac epoxy resin. Water-based epoxy emulsions are sold as commercial products, and typically include about 5 to about 10% of a proprietary emulsifier. For best results, the emulson is preferably about 30 to 70% by weight solids.

The resin portion of the composite also includes about 2 to about 4 phr (parts per hundred parts resin, where "resin" means the weight of the epoxy resin) of a water-compatible curing agent. (A component of the resin is "water compatible" if it is water soluble, water miscible, or water emulsifiable). The curing agent should be B-stageable and should provide for latent curing of the epoxy after it has been B-staged. The preferred curing agent is dicyandiamide because it is a latent curing agent which can be prepregged. Other curing agents that can be used include methylolaten dicyandiamide, monuron and other water compatible compounds that provide latency, such as amino compounds, amido-amines, and carboxylated compounds.

The resin portion also includes about 0.1 to about 0.4 phr of a water-compatible catalyst for the epoxy. Suitable catalysts include 2-methylimidazole and quaternary amines such as benzyl dimethyl amine and trimethyl phenol and aminomethyl phenol. The preferred catalyst is 2-methylimidazole as it results in a reasonable amount of B-staging in a relatively short time.

The resulting laminate may be made flame retardant by reacting the epoxy resin with bromine as is known in the art. Also, a pre-brominated water emulsified epoxy resin can be purchased commercially. Up to about 20% by weight of the epoxy can be brominated. In addition, the resin portion of the laminate can contain various fillers, dyes, pigments, thixotropic agents, and other components conventionally included in laminates, as is known to those skilled in the art. Small amounts (about 5 to about 10%) of organic solvents that are water compatible, such as ethenol and toluene, can be included in the resin portion of the composite. However, this is not preferred as it creates a pollution problem, adds additional cost, and generally offers no beneficial effects.

The composite is formed from about 30 to about 60% by weight of the polyaramid fabric and about 40 to about 70% by weight of the resin. A preferred composition is about 45 to about 55% polyaramid fabric and about 45 to about 55% resin. While the composition can be prepared in a number of ways, it is preferable to dissolve the curing agent in water and mix it and the catalyst with the epoxy emulsion at room temperature. Water is then added to adjust the viscosity.

To prepare the pregreg, the fabric is dipped into the resin and excess resin is wiped off. The coated fabric is then B-staged, typically at about 150° C. for 4 to 8 minutes, depending upon the particular catalyst used and its concentration, and the desired degree of greenness of the prepreg.

The laminate is prepared by stacking one or more prepregs. A copper sheet is placed on one or both ends of the stack if a copper clad laminate is to be made. A typical procedure for multilayer application is to use a single prepreg placed between two copper sheets. The stack is then pressed, generally at about 200 to 1000 psi, and preferably at about 500 psi, while being heated at about 180° C. for about 1 hour, depending upon the particular resin system being used, and the thickness of the stack. The resulting laminate is preferably cooled under pressure. The copper sheet on the laminate is etched into a circuit pattern and the components are mounted onto the resulting printed wiring board.

While any type of aramid laminate can be prepared according to this invention, the preferred application is to make printed wiring boards for leadless chip carriers made of ceramic material as the advantages of this invention are directed to problems which arise when of leadless chip carriers, particularly hermetic chip carriers (made of ceramic material), are mounted on polyaramid containing printed wiring boards.

The following examples further illustrate this invention.

EXAMPLE 1

The following resins were prepared:

| Composition | A | B | C |
|---|---|---|---|
| Water-based emulsion of diglycidyl ether of bisphenol A, 60% solids, 650 wt % epoxide based on solid content, sold by Celanese Corp. as "CMD 35201" | 100 | — | — |
| Water-based emulsion of 20% brominated diglycidyl ether of bisphenol A, 60% by weight solids, sold by Celanese Corp. as "CMD W60-4520" | — | 100 | 100 |
| Dicyandiamide | 2.8 | 2.8 | 4 |
| 2-Methylimidazole | 0.2 | — | — |
| Benzyl dimethylamine | — | 0.2 | 0.2 |

Three styles of "Kevlar" fabric were used to make the prepreg and laminates. These were obtained from Clark-Schwebel Corp. and are described as follows:
CS350—Plain weave, 34×34 count, 0.003" thick
CS351—Plain weave, 22×22 count, 0.004" thick
CS352—Plain weave, 17×17 count, 0.009" thick
All three styles of fabric were obtained with the "CS-815" epoxy compatible surface finish.

The impregnating formulations were prepared by dissolving the dicyandiamide in deionized water (5 to 30 times the weight of the dicyandiamide was used) at 70° C. The catalyst was added to the warm mix and the mix was then added to the epoxy suspension at room temperature. Before the epoxy was removed from its storage container, a high shear, high speed mixer was used to make sure there was no settling out of the suspension. The amount of water used in dissolving the dicyandiamide was selected to adjust the impregnated viscosity to provide different amounts of resin content in the prepregs and laminate.

Prepegs were made by hand dipping the fabric in the resin mixes, followed by drying and B-staging in a hot-air circulating oven at 150° C. Residence time in the oven was anywhere from 4 to 8 minutes, depending upon the greenness desired, but generally about 6 minutes was used. The dry prepregs were cut and stacked with enough plys to make laminates approximately 1/16" thick and ⅛" thick. If a copper clad laminate was to be produced, a sheet of 1 oz. copper, treated on one side for printed wiring board applications, was used on either side of the stack.

The stack was laminated and cured in a heated press. The pressing was initiated at room temperature at a pressure of 200 to 1,000 psi; most typically 500 psi was used. The temperature was increased at a rate of about 5° C./min to 180° C. where the temperature was held for 1 hour. The laminates were cooled under pressure. Laminates made from formulation A had a $T_g$ after 1 hour at 180° C. of about 88° C., which may be considered to be low for many printed wiring board applications. Laminates made from formulation B had a higher $T_g$ of about 110° C., which is acceptable for printed wiring board applications. Laminates made from formulation C were made with additional dicyandiamide to determine if that would increase the $T_g$, but it did not. It was found that laminates made from formulation A passed the 250° C. solder float blister resistance test after 15 minutes exposure to 15 psig steam. Laminates made from formulations B and C passed the 250° C. solder float blister resistance test after 30 minutes exposure to 15 psig steam.

Test samples of 2"×2" were cut from the 1/16" and ⅛" thick thickness laminates. These were thermally cycled as follows: After 10 minutes at −60° C.±5° C., the laminates were kept at room temperature for 5 minutes then placed in an air-circulating oven at 150° C.±2° C. for 10 minutes, then at room temperature for 5 minutes to complete one cycle. The surface of the laminate was examined by scanning electron microscopy for microcracks before and after cycling. Laminates made from resin formulations A, B, and C showed no microcracking after 20 cycles using style 351 "Kevlar" fabric. Laminates made from formulation A showed no cracking up to 20 cycles when tested with style 350 and 352 fabrics. Laminates made from formulation A also showed no microcracks after 100 cycles when made with style 350 fabric without any surface finish. Lamintes made from formulations B and C using the thicker Kevlar fabric style 352 showed a few microcracks after 20 cycles.

Laminates with 50% resin content made from the 351 style Kevlar and formulations A, B, and C were cycled up to 50 times and no microcracks were noted. Further cycling up to 35 cycles resulted in one or two microcracks in each laminate. For comparison, a typical FR-4 resin after only 10 cycles will produce numerous microcracks. The following table summarizes the results of these expriments. For comparison, laminates made with commercial materials examined microcracked in 10 cycles or less.

|  | Composition A | | Composition B | |
|---|---|---|---|---|
|  | Style 351 Kevlar, 50-55% Resin Content | Style 352 Kevlar, 35% Resin Content | Style 351 Kevlar, 50-55% Resin Content | Style 352 Kevlar, 35% Resin Content |
| Tg (°C.) | 88 | 88 | 110 | 110 |
| 250° C. Solder Blister Resistance | 15 mins @ 15 psi steam | 15 mins @ 15 psi steam | 30 mins @ 15 psi steam | 30 mins @ 15 psi steam |
| Brominated Resin | No | No | Yes | Yes |
| TCE ($10^{-6}$/°C.) at Room Temp. | 5.9 | 3.5 | 5.7 | 3.7 |
| Non-microcracking (Cycles Passed) | 50 | 20 | 50 | 20 |
| Dielectric Properties @ 20 MHZ 80° C. | | | | |
| $\epsilon$ | | 4.32 | | |
| $\tan_\delta$ | | 0.07 | | |

EXAMPLE 2

The following resin composition (Composition D) was prepared.

| Component | Wt. (gm) |
|---|---|
| Tri-functional diglycidyl ether, bisphenol A, water-based emulsion, 55% solids, sold by Celanese Corporation under trade designation "CMDW55-5003" | 745 |
| Dicyandiamide | 30 |
| Benzyldimethylamine | 1.2 |

This formulation was impregnated onto 350 style Kevlar ® fabric, B-staged and laminated as in Example 1. The laminates were cycled 40 times from −55° C. to +150° C. When observed under a scanning electron microscope, many cracks were noticed.

In order to toughen the above resin formulation, additional formulations were prepared:

|  | Composition E (Gms) | Composition F (Gms) |
|---|---|---|
| "CMDW55-5003" | 745.5 | 745.5 |
| Dicyandiamide | 29.8 | 29.8 |
| Ethylene vinyl acetate sold by Air Products Co. as Airflex 400 | 155.6 | — |
| Tridimethyl Aminomethyl Phenol sold by Rohm & Haas as "DMP-30" | 1.2 | 1.2 |
| Copolymer of ethylene vinyl chloride sold by Air Products Co. as "Airflex 4500" | — | 155.6 |

Formulations E and F were impregnated on Kevlar ® style 350 fabric, B-staged 6 minutes at 150° C., at which point they were non-tacky. The prepregs were cut, stacked to make 1/16" thick laminates, and laminated at 1,000 psi in a hot press at 180° C. and maintained at 180° C. for 1 hour. The laminates were cooled under pressure. They were subject to 40 thermal cycles from −55° C. to +150° C. When examined under a scanning electron microscope, only a few small surface cracks were noted. These were different in character from the normal microcracks which begin in the interior of the laminate and propagate to the surface. We believe that these few microcracks were the result of expulsion trapped volatiles (water from the laminate). Laminates from formulation E and F were analyzed using the dynamic mechanical analyzer, and a$T_g$ of about 150° C. was recorded for both formulations.

We claim:
1. A composite comprising
   (A) polyaramid woven fabric; and
   (B) a resin which comprises
      (1) water;
      (2) a water-based emulsion of an epoxy selected from the group consisting of diglycidyl ethers of bisphenol A, diglycidyl ethers of bisphenol F, novolacs, and mixtures thereof;
      (3) a water-compatible, curing agent for said emulsion; and
      (4) a water-compatible catalyst for said emulsion.
2. A composite according to claim 1 which is about 30 to about 60 wt.% said polyaramid woven fabric and about 40 to about 70 wt.% said resin.
3. A composite according to claim 1 wherein said epoxy is a diglycidyl ether of bisphenol A.
4. A composite according to claim 1 wherein said emulsion is about 30 to about 70 wt.% solids.

5. A composite according to claim 1 wherein said emulsion includes about 5 to about 10% of an emulsifier.

6. A composite according to claim 1 wherein said curing agent is about 2 to about 4 phr dicyandiamide.

7. A composite according to claim 1 wherein said catalyst is about 0.1 to about 0.4 phr 2-methylimidazole.

8. A composite according to claim 1 wherein said epoxy is brominated.

9. A composite according to claim 1 wherein said polyaramid is poly (p-phenylene terephthalamide).

10. A composite according to claim 1 wherein said woven fabric is plain weave.

11. A composite according to claim 1 which is about 45 to about 50 wt.% said polyaramid woven fabric and about 45 to about 55 wt.% said resin.

12. A composite according to claim 1 wherein said resin is B-staged.

13. A composite according to claim 1 wherein said resin is fully cured.

14. A composite comprising
(a) about 45 to about 55 wt.% poly (p-phenylene terephthalamide) woven fabric; and
(B) about 45 to about 55 wt.% resin which comprises
(1) a water-based emulsion of a diglycidyl ether of bisphenol A having a solids content of about 30 to about 70 wt.%;
(2) about 2 to about 4 phr dicyandiamide; and
(3) about 0.1 to about 0.4 phr 2-methylimidazole.

15. A copper clad laminate comprising a stack of at least one outer copper sheet and at least one B-staged prepreg made of a composite according to claim 1, pressed and fully cured.

16. A printed wiring board comprising a laminate according to claim 15 wherein said copper sheet is in the form of a circuit pattern.

17. A printed wiring board according to claim 16 having at least one hermetic leadless chip carrier mounted thereon.

18. A method of making a laminate comprising B-staging a composite according to claim 1 to form a prepreg, and pressing and heating at least one prepreg to fully cure said resin.

19. method according to claim 18 wherein said B-staging is at about 150° C. for about 4 to about 8 minutes, said pressing is at about 200 to about 1000 psi, and said heating is at 150° C. per minute increments to about 180° C., followed by heating at about 1800° C. for about 1 hour.

* * * * *